United States Patent [19]
Cade

[11] 3,986,180
[45] Oct. 12, 1976

[54] DEPLETION MODE FIELD EFFECT TRANSISTOR MEMORY SYSTEM

[75] Inventor: Paul Edmand Cade, Milton, Vt.

[73] Assignee: International Business Machines Corporation, Armonk, N.Y.

[22] Filed: Sept. 22, 1975

[21] Appl. No.: 615,262

[52] U.S. Cl. .................... 340/173 CA; 340/173 R; 357/22; 357/41
[51] Int. Cl.² .................. G11C 11/24; G11C 11/40
[58] Field of Search ............... 340/173 CA, 173 R; 357/22, 23, 41, 51; 307/238

[56] References Cited
UNITED STATES PATENTS
3,916,390   10/1975   Chang et al. .................... 340/173 R Primary Examiner—Stuart N. Hecker
Attorney, Agent, or Firm—Francis J. Thornton

[57] ABSTRACT

The present invention relates to an integrated memory system comprising an array of depletion mode field effect transistors operated in a common control electrode mode to provide an array with the density of metal oxide semiconductor field effect transistor arrays and the speed of bipolar transistor arrays. Each transistor of the array has a gate or control electrode surrounding a channel region of the device which gate is held at a reference potential with respect to the source and drain regions which are selectively biased.

The invention can be utilized in both a random access memory and a read only memory mode. The read only mode is somewhat of a simpler structure capable of a higher density than that of the random access. In both cases a low capacity, high density, high speed memory which is self limiting as to current and which uses a lower power requirement than comparable Bipolar memories is realized.

The field effect transistors of the invention are readily formed using existing processes that will permit bipolar devices to be made on the same chip.

12 Claims, 10 Drawing Figures

`3,986,180`

DEPLETION MODE FIELD EFFECT TRANSISTOR MEMORY SYSTEM

BACKGROUND OF THE INVENTION

1. Field of the Invention

This invention relates to information storage systems and particularly to systems that use a semiconductor device as the active element and a capacitor as the storage element.

2. Description of the Prior Art

Memory systems of which each storage cell is formed of but one capacitor and one active element are well known to the prior art.

U.S. Pat. No. 2,828,447, entitled, "Neon Capacitor Memory System" issued Mar. 25, 1958, to J. W. Mauchly, teaches the use of a memory storage matrix which includes memory cells comprising a capacitor and a bilateral conducting neon gas tube. Information is stored on a plurality of capacitors directly coupled to a common bit/sense line. Each gas tube acts as a threshold dependent switching element.

U.S. Pat. No. 3,196,405, entitled, "Variable Capacitance Information Storage System," issued July 20, 1965, to J. B. Gunn and assigned to the assignee of the instant invention, teaches a capacitive memory system utilizing a pair of diodes, connected front-to-back, and a capacitor to form a memory cell. Although the memory provides nondestructive readout, bipolar control signals are necessary and data inversion taken place upon readout.

U.S. Pat. No. 3,553,658, entitled, "Active Storage Array Having Diodes for Storage Elements," issued Jan. 5, 1971, to W. D. Pricer and assigned to the instant assignee, teaches the use of capacitive memory cell comprising only two back-to-back connected diodes.

The article, "Vertical Diode-Capacitor Memory Cells," W. H. Chang et al, IBM Technical Disclosure Bulletin February 1973, pages 287–9, teaches an integrated capacitive memory cell which includes a single diode and capacitor.

Both of the last two referred to memory systems utilizing diodes have the disadvantage of requiring load devices to limit the forward current and also the disadvantage of conducting at low forward voltages leading to noise problems.

U.S. Pat. No. 3,387,286, entitled, "Field Effect Transistor Memory," issued June 4, 1968 to R. H. Dennard and assigned to the present assignee, describes an array of semiconductor memory cells each comprising only a single metal oxide semiconductor enhancement mode field effect transistor (MOSFET) coupled to a storage capacitor. The MOSFET acts as a gating element and has its drain electrode connected to a bit/sense line and its gate electrode connected to a word line. The storage capacitor is coupled between the source electrode of the MOSFET and a reference potential. An inherent problem in the use of MOSFET elements in memory cells is their comparatively slow operation.

U.S. Pat. No. 3,876,992, entitled, "Bipolar Transistor Memory with Capacitive Storage," issued Apr. 8, 1975 to W. D. Pricer, and assigned to the instant assignee, discloses an integrated memory cell comprising only a single bipolar transistor and a capacitor. Although these bipolar cells have an inherently high speed than MOSFET's they have a significantly lower density because of the necessary isolation regions surrounding each cell.

Another variation in the integrated capacitive storage area is taught in U.S. Pat. No. 3,676,715, entitled, "Semiconductor apparatus for Image Sensing and Dynamic Storage," issued July, 11, 1972, to S. Brojdo, which describes the use of a PN-junction diode coupled with a depletion voltage variable capacitor as a storage element. Stored information is represented by the presence or absence of carriers in a depletion region created by a field effect gate electrode. In order to write logical 1's and 0's into the storage cell a two step operation is necessary which undesirably causes the cycle time to be extended.

Another version of the FET/capacitor memory cell is disclosed in U.S. Pat. No. 3,705,391, entitled, "Memory System Employing Capacitance Storage Means," issued Dec. 5, 1972, to R. H. Baker, which describes the use of a plurality of independently accessible FET devices serially connected through storage capacitances to a common input/output line. The memory system is organized and operates in a similar manner to that of the Dennard reference.

A depletion mode field effect transistor in which a gate is disposed in a semiconductor body surrounding a channel region, it is taught in U.S. Pat. No. 3,295,030 and its divisional companion case 3,427,212. A similar type current modulated field effect transistor is also taught in U.S. Pat. No. 3,430,113.

In summary, although numerous variations of capacitive memory storage elements have been previously disclosed, there exists certain inherent limitations in these systems which prevents their efficient application in data processing information storage systems. And while each of the above techniques utilizes only a single active switching device and a single capacitor as a memory cell to achieve maximum density, the bipolar device versions are limited somewhat in density due to the requirement of isolation regions while the FET versions are limited in their performance. The diode/capacitor memory cells utilizing avalanche breakdown present a reliability problem.

RELATED APPLICATIONS

In a copending patent application Ser. No. 587,528, entitled, Multiple Emitter Charge Storage Memory, filed by W. D. Pricer, et al in June 1975, and assigned to the same assignee there is described:

An integrated circuit memory system which includes capacitive storage memory cells capable of storing $n$ bits of information on $n$ capacitors associated with multiple emitters of a bilaterally conductive bipolar transistor. Each capacitor is coupled to a separate bit/sense line. Access of a storage cell is achieved by forward biasing the common base/collector junction of the bipolar transistor. Writing is achieve by driving the bit/sense lines to charge or discharge the storage capacitors during an access cycle. In reading, or sensing, the charge state of each storage capacitor is determined by sensing potential changes on the bit/sense lines during access.

SUMMARY OF THE INVENTION

Accordingly, it is an object of the instant invention to improve the performance and density of integrated semiconductor memory systems by providing performance and speed achievable by bipolar devices with the density found in MOSFET technologies.

The present invention is directed toward a memory array using a depletion mode field effect transistor having a gate surrounding the channel region which gate is operated in a common electrode mode.

It is, therefore, an object of the invention to provide a low capacity high density high speed memory which is self-limiting as to current and thus does not require current limiting devices when compared with prior art memories.

It is also an object of the invention to provide a memory array which has the low power requirements of field effect memories and has the high speeds of bipolar memories.

It is a further object of the invention to provide a memory cell circuit using a transistor which has its control electrode operated in a common mode with respect to its input electrode and its output electrode; that is, the control electrode is at a reference potential, the input signal is applied between or referenced between the input electrode and the control electrode, and the output signal is taken between or referenced between the output electrode and the control electrode.

It is still a further object of the invention to describe a complete memory array cell in which the support circuits can be formed in the same integrated circuit structure during the formation of the basic memory array elements.

In accordance with the present invention a memory system is provided comprised of intersecting word and bit lines and semiconductor memory cells coupling the word and bit lines where each cell comprises a capacitor, a field effect transistor having a drain, a source, a channel region connecting the source and the drain and a gate surrounding the channel region, and driver means for driving said intersecting word and bit lines.

It is another object of the invention to provide a memory system having high noise immunity.

The foregoing and other objects, features, and advantages, of the invention will be apparent from the following more particular description of the preferred embodiment of the invention as illustrated in the accompanying drawings.

IN THE DRAWINGS

DESCRIPTION OF THE PREFERRED EMBODIMENT

Figure 1:
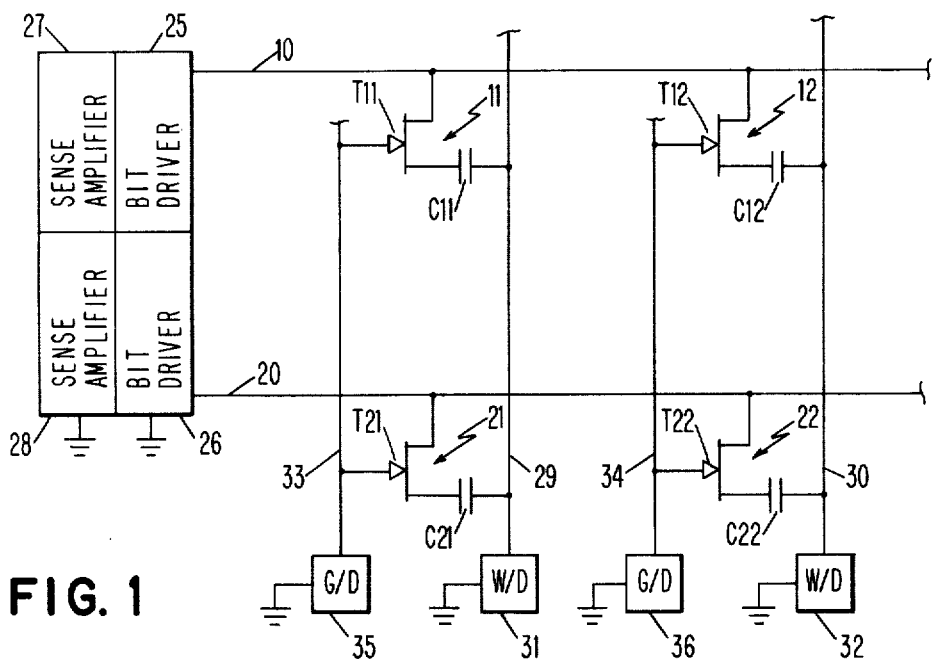
FIG. 1 illustrates schematically a random access memory array in accordance with the present invention.

FIG. 1 shows schematically a word organized random access memory according to the present invention. The organization shown comprises an array of two words each containing two bits. For purposes of the present description and embodiment, it will be assumed that the depletion mode field effect transistors shown in the array utilize N channel operation. In FIG. 1 numerals 10 and 20 denote the two bit lines of the array. Of course, it should be understood that the array can have any desired number of bit lines containing any number of bits therein even though only two bit lines each containing but two bits is shown in the embodiment. Each bit line 10 and 20 has two cells coupled to it. Bit line 10 is coupled to cells 11 and 12 and bit line 20 is coupled to cells 21 and 22. Each cell comprises a transistor and a capacitor and stores a single bit. Cells 11 and 12 thus respectively comprise transistors T11 and T12 and capacitors C11 and C12, while cells 21 and 22 respectively comprise transistors T21 and T22 and capacitors C11 and C12. Each bit line 10 and 20 is also coupled to a respective bit line driver 25 and 26 and a respective current sense amplifier 27 and 28. The Bit Line drives 25 and 26 are capable of impressing upon each respective bit line selected voltage potentials.

Transistors T11 and T12 and bit line 10 and transistors T21 and T22 and bit line 20 are organized into two rows for selection purposes and the source electrodes of each of the transistors in any given row are coupled to a respective word line 29 and 30 through their respective capacitors. Thus, for example, transistors T11 and T21 form one row and have their sources respectively coupled to word line 29 through respective capacitors C11 and C21, while transistors T12 and T22 form a second row and have their sources respectively coupled to word line 30, through respective capacitors C12 and C22. Each word line 29 and 30 is coupled to a respective word driver 31 and 32 capable of impressing on each respective word line selected voltage potentials. The gate of each of the transistors T11 and T21 is connected via a gate line 33 to a gate driver 35 while the gates of transistors T12 and T22 are connected via a gate line 34 to a gate driver 36.

For purposes of explanation it will be assumed in the following example that a discharge capacitor in a memory cell is indicative of a binary 1 and a fully charged capacitor is indicative of a binary 0. Thus, the introducing of charge into a capacitor of any particular cell will be in effect writing a 0 while the discharging of a capacitor will be in effect be writing a 1. Once the capacitor of each cell has been suitably charged or discharged, the state of each cell is distinctive and this distinctive state can be read without effecting any adjacent cell on either side of the same word line or the same bit line. Reading of any of the cells of the array consists of biasing the bit lines and grounding of the respective gate and word lines of the cells being read. Because this read operation introduces charge into the capacitor it effectively writes a 0 in every cell being read and is considered a destructive read operation and it is necessary to rewrite a read 1.

The sense amplifier used must not only be capable of reading a 1, but must also include means for rewriting a 1 into a read cell. A suitable sense amplifier would thus include a current-detecting circuit and a clocked latching circuit that will be set by the read 1 into a state that will bring the bit line to ground during a write cycle.

Figure 2:
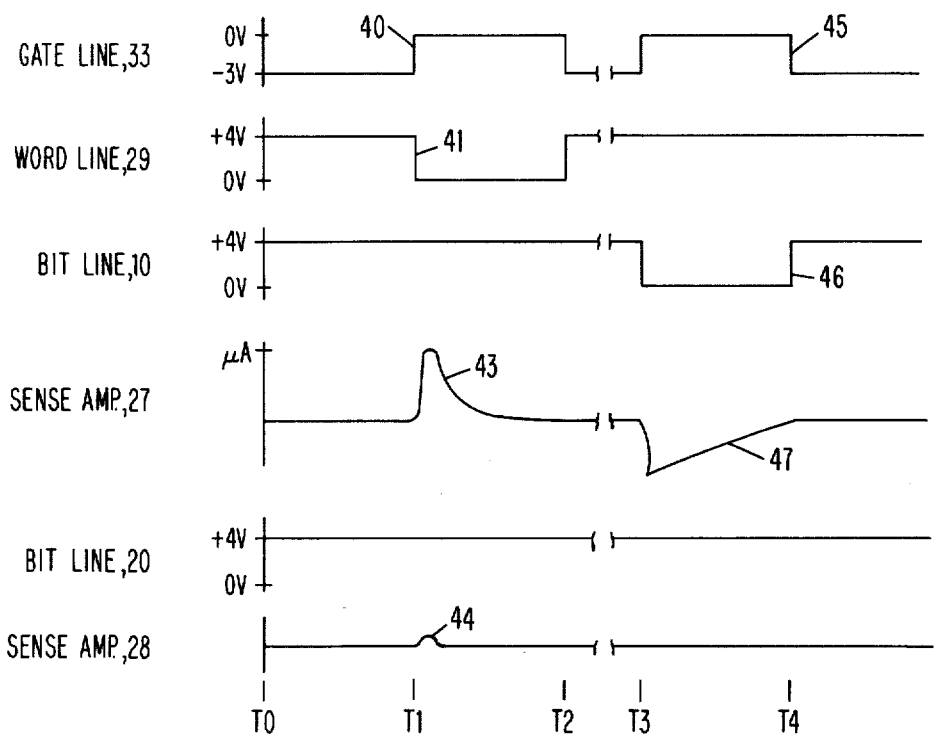
FIG. 2 shows the read and write wave forms associated with the memory array of FIG. 1.
Figure 7:
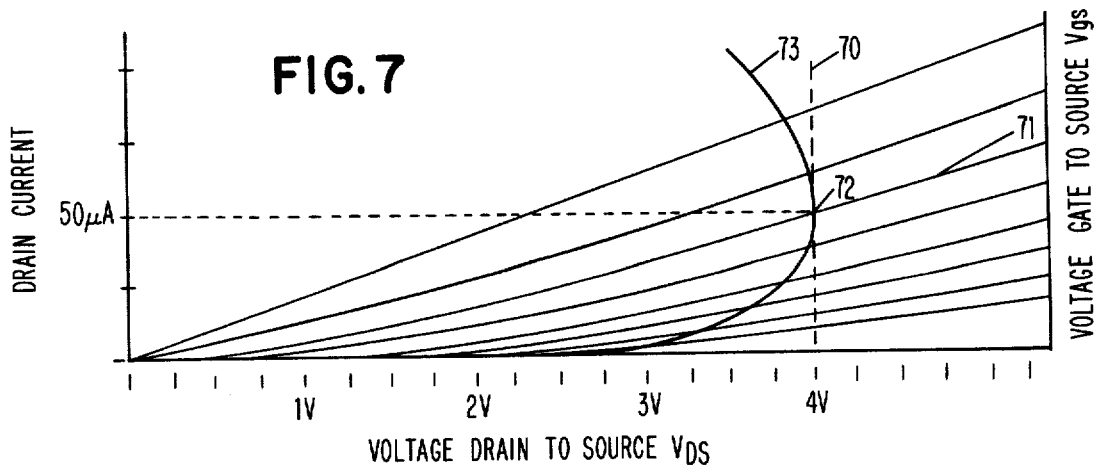
FIG. 7 is a family of curves of drain current versus drain to source voltage for various gate to source voltages.

In the following specific example, only a single word line 29 and gate line 33 will be used to indicate the write and read operations of the array. Initially, it will be assumed that capacitor C11, coupled to transistor T11, is fully discharged; i.e., indicative of a 1 state, while capacitor C21, coupled to transistor T21, is fully charged; i.e., indicative of a 0 state. At time Tc, as shown in FIG. 2, all cells are in their quiescent state in which bit line 10 and 20 are at +4 volts, gate line 33 and gate line 34 are both at −3 volts, while the word lines 29 and 30 are both at +4 volts. At a suitable time, T1, a read cycle, is initiated, and the gate line 33 is raised by gate driver 35 from −3 volts to ground or 0 volts, as indicated by pulse 40 in FIG. 2. Simultaneously, the word driver 31 causes the word line 29 to go to ground or 0 volts from +4 as shown by pulse 41. The bit lines 10 and 20 remain at +4 volts. In this condition the transistors T11 and T21 are both conductive. Since, however, capacitor C11 has been indicated as being discharged, zero potential exists between the gate and drain nodes of transistor T11 causing the instantaneous point of operation of the transistor T11 to lie somewhere in the Vgs = 0, curve 71 of FIG. 7. Also since the instantaneous potential on C11 is zero, the drain to source potential is $V_{DS}$ = +4 volts, Curve 70. The instantaneous operating point 72 must, therefore, lie at the intersection of these two curves.

The initial instantaneous drain current is then uniquely determined from this operating point 72 and is very large as indicated by pulse 43 in FIG. 2. As drain current continues to flow, the capacitor starts to charge having a positive potential on the transistor T11 side with respect to the word line 29 side. The capacitor voltage now causes the gate to be reversed biased by the same potential, and additionally, causes the drain to source voltage to be reduced by the same amount causing the point of operation to follow the locus of operation as shown by curve 73 in FIG. 7. The current quickly drops in magnitude as the voltage on the capacitor rises towards the gate to source voltage at which the transistor is cut off. This current pulse 43 can be converted to a voltage and used to set a clocked latch in the sense amplifier 27. The latch is such that when set it will, during the write cycle, cause the bit line to be grounded.

During this read cycle, sense amplifier 28 detects little or no current flow, since the charge on capacitor C21 provides a gate to source potential holding transistor T21 near cut off. The slight pulse of current 44 shown in FIG. 2 is caused by recharging the capacitor C21 of any slight amount of charge that may have leaked off while the device was in the quiescent state. This current pulse will not set the latch in sense amplifier 28.

Because the gate line 34 and the word line 30 of transistors T12 and T22 were held at steady voltages of −3 volts and +4 volts respectively, the devices T12 and T22 are not conductive. At time T2, after the capacitor C11 has been fully charged, the read cycle is terminated. To do so, the word line 29 is again raised to its quiescent voltage of +4 volts, and the gate line is lowered to its quiescent voltage of −3 volts and Transistors T11 and T21 turned off.

This read cycle is destructive of the 1 previously stored in the cell 11 because capacitor C11 has now been charged; that is, cell 11 has had a 0 written into it.

Thus, if one wishes cell 11 to continue to store a 1, the cell must now be rewritten into a 1 state; i.e., capacitor C11 must be discharged. Cell 11 can be rewritten into a 1 state as follows: at time T3, a clock pulse is supplied to the sense amplifiers 27 and 28, the previously set latch in amplifier 27 causes bit line 10 to be brought to ground, as indicated by pulse 46. Simultaneously, the gate line 33 is also brought to ground, as indicated by pulse 45. The word line 29 is maintained at +4 volts. Once again, the transistor T11 becomes conductive, and the charge introduced into capacitor C11 is discharged through the device onto the grounded bit line 10. This discharge of current would be indicated in the sense amplifier 27 as a negative going pulse 47. Because the latch in sense amplifier 28 was not set by pulse 44, the bit line 20 remains at +4 volts, transistor T21 does not turn on and capacitor C21 remains charged. By maintaining a gate line 34 at −3 volts when bit line 10 is brought to ground, transistors T12 and T22 remain in a cut off state and cells 12 and 22 remain undisturbed. In this way, the cells can be read and written. Following the write cycle, the latch would be reset.

Figure 3:
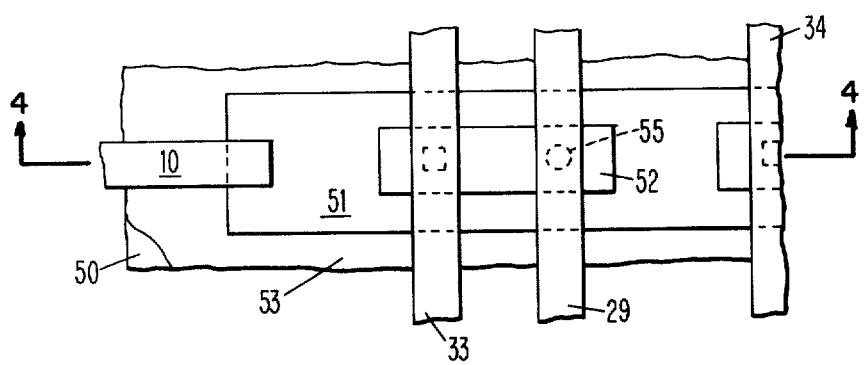
FIG. 3 illustrates a top view of a preferred cell of the array shown in FIG. 1 of the present invention.
Figure 4:
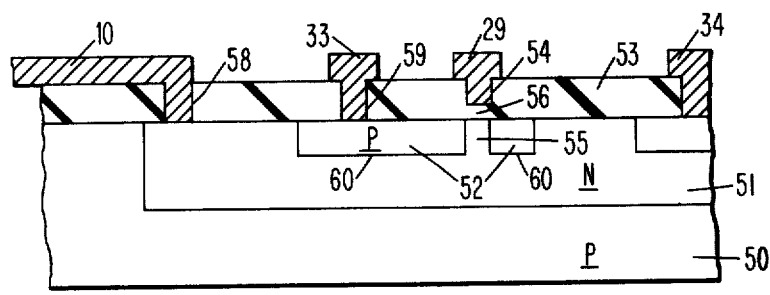
FIG. 4 illustrates a sectional view of FIG. 3 taken along the lines 4—4.
Figure 5:
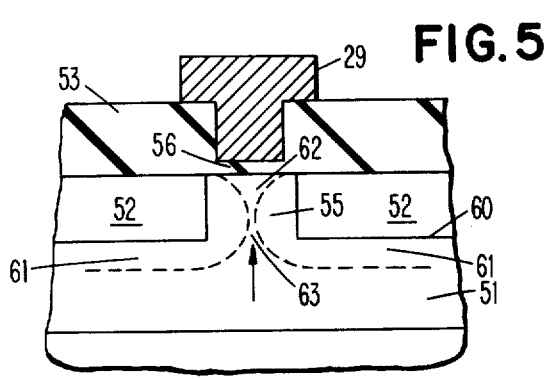
FIG. 5 illustrates the physical operation of the cell of FIG. 4 when the cell is being read.
Figure 6:
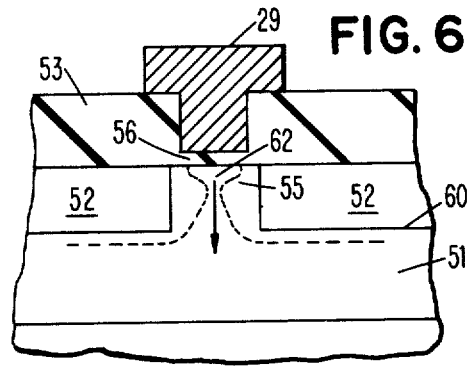
FIG. 6 illustrates the physical operation of the cell of FIG. 4 when a 1 is being written into the cell which previously contained a 0.

To fully describe the operation of the individual transistor cells indicated in FIG. 1, reference should now be made to FIGS. 3, 4, 5, 6, and 7. For purposes of illustration only, FIG. 3 shows a top view of a preferred embodiment the cell 11 of FIG. 1. FIG. 4 shows a cross-sectional view of the same cell. FIGS. 5 and 6 show the channel region of FIG. 4 greatly enlarged. As indicated, the transistor T11 of the cell 11 is created in a P type semiconductor body 50 of homogenous elementry semiconductor material of 1 to 20 ohm centimeter. The transistor T11 is formed by diffusing a N type region 51 and a P type region 52 into body 50. The region 51 serves as the drain of transistor 11 and is similar to collector regions found in integrated bipolar transistors. This region 51 is surrounded by body 50. The second diffused region 52 of P type material serves as the gate of transistor T11 and forms a PN junction 60 with the region 51. This gate region 52 is formed with a circular opening therein. This circular opening permits the N type material forming region 51 to extend in a mesa-like configuration to the surface of the body to form channel region 55. The upper portion of this channel is the source of transistor T11. Overlying the surface of the body is an insulating layer 53. This layer 53 may be, for example, composed of silicon dioxide formed by conventional techniques and having a thickness of approximately 6,000 to 8,000 Angstroms. This layer 53 is modified by known and conventional methods, such as etching, to create an opening 54 over the channel region 55. A thin oxide layer 56 having a thickness of approximately 300 Angstroms is then regrown over the channel 55 such that with normal operating voltage tunneling of carriers cannot occur from the channel region through the oxide. After formation of this thin oxide layer 56, openings 58 and 59 are also made through the oxide layer 53 to expose the N type region 51 and the P type region 52. The bit line 10 in the form of a metallic conductive line is deposited on the device so as to contact the region 51 through the opening 58. The gate line 33 is deposited such as to contact the gate region 52 through the opening 59 and the word line 29 is deposited such as to overline the thin oxide 56 created over the channel region 55. The deposited word line 29 where it overlies the thin oxide 56 serves as one plate of capacitor C11. The other plate of capacitor C11 is the upper surface of the channel region 55.

Various methods and techniques for forming the layers, the gate oxides, the electrodes, the doped regions, etc. are well known to those familar with the semiconductor art and a specific description of this process is not intended to limit the invention since other techniques could well be used.

The capacitor C11 formed between the upper surface of the channel 55 and the word line 29 through the thin oxide 56 can be made to contain a quantity of charge just beneath the surface of the semiconductor in the channel region 55. As indicated previously, presence of such charge here in the channel region can be used to represent a 0 in binary language. When such charges are not present at the surface of the channel region 55 underlying the word line 29 the capacitor is not charged and the absence of such charges thus represent a 1 in binary language. Thus, by charging or discharging the capacitor created in this fashion the described depletion mode field effect transistor in conjunction with the associated capacitor can be used as a memory cell.

To illustrate more fully the operation of the cell reference should now be made to FIG. 5 wherein the channel region 55 of the device, shown in FIG. 4, is shown in a greatly enlarged view. As made the capacitor contains no charge and the cell is in its quiescent state, that is the word and bit lines 10 and 29 are maintained at +4 volts and gate line 33 is at −3 volts. Since there is initially no charge stored in the capacitor C11 formed by the line 29, the thin oxide layer 56 and the top of channel 55 the voltage appearing on word line 29, that is +4 volts, will also appear at the top of the channel 55. This causes the PN junction 60 existing between region 52 and 51 to be strongly back biased forming a depletion region 61 around the PN junction 60. For purposes of illustration only the boundries of this depletion region 61 in the N type region 51 are shown by the dotted lines in FIG. 5. If the gate line 33, connected to region 52, and the word line 29 are brought to ground from their quiescent voltages a voltage swing is coupled to the top of the channel region 55 by means of the capacitor action of the thin oxide layer 56 and the depletion region at the top of the channel, shrinks forming a pocket 62. This occurs because the only voltage available to support the depletion region 62 consists of the contact potential due to the impurity doping levels of the channel 55 and gate 52. This distortion and retraction of the depletion region continues downward from the pocket 62 forming a continuous conductive path 63 to the undepleted portion of region 51 existing below the gate. At this instant in time one side of the thin oxide layer 56 is connected to ground by means of metal word line 29 and the other side connected to +4 volts by means of the conducting path 63 and pocket 62 through the channel 55 causing the instantaneous point of operation of the transistor T11 to lie somewhere on the Vgs = 0 curve 71 of FIG. 7. Also since the instantaneous potential on capacitor C11 is zero the drain to source potential is $V_{DS} = +4$ volts shown as the dotted vertical line 70. The instantaneous operating point 72 must, therefore, lie at the intersection of these two curves. The initial instantaneous drain current is then uniquely determined from this operating point 72 and is very large as indicated by pulse 43 in FIG. 2. A charge flow, i.e. drain current is thus initiated to provide electrical equilibrium across the capacitor thus formed. With this current flow, the capacitor charges and the voltage across the capacitor starts to increase causing the gate to be eventually reversed biased and the drain to source current to be reduced by the same amount thus the voltage available to support the depletion region also increases causing the depletion region to expand into the channel region. Eventually the depletion region 60 will again expand to pinch off the conducting path 63 in the channel and the drain current through the channel quickly drops in magnitude as the voltage on the capacitor rises towards the gate to source voltage at which the transistor is cut off. This is shown by the locus of operation curve 73 in FIG. 7. Because the depletion region 60 now extends across the pinches off the entire channel region, the charge introduced into the pocket 62 at the top of channel 55 by this drain current will remain trapped therein. If the gate line 33 is now returned to −3 volts, the word line 29 returned to +4 volts, with the bit line 10 remaining at +4 volts the depletion region 60 will remain strongly back biased. Because of this trapped accumulated charge in pocket 62 the capacitor C11 now contains, in accordance with the previously made assumption, a binary 0. When a 1 is to be written to the same memory cell as indicated in FIG. 2 the gate 33 is again raised to ground while the word line 29 is maintained at +4 volts. Simultaneously, with the raising of the gate line the bit line 10 is also reduced to ground from +4 volts. The application of these voltages now causes the depletion region in the bottom of the channel 55 to shrink, forming a conductive path upwards from the undepleted region of 51 to the trapped charge in pocket 62 at the oxide-channel interface. Any charges which were previously trapped in the pocket 62 beneath the word line 29 are now released and the capacitor discharges as indicated by pulse 47 in FIG. 2. Because the capacitor C11 no longer has any charges trapped therein, it is again in a discharged condition and a 1 has been written therein. To read this 1, voltages similar to the write 0 step are applied again causing current to flow to fill the void caused by the application of these voltages and this current flow is indicative of a binary 1 being present in the previously discharged cell.

Thus, it is clear that two current levels are generated and that one can store sufficient voltage on the capacitor to assure that for each charge state of the selected cell that a sufficient current differential exists.

The describes array indicates that information can be stored in the described cell and that depending upon the stored voltage a drain current will be produced since this either raises or lowers the source potential with respect to the gate voltage. A difference in this current is measured on the bit line and can be interpreted as either a logical 1 or a logical 0. Further, it should be noted that the charge of this capacitor can be refreshed by the standard technique of manipulating the voltages on the word and bit line as indicated. The unique layout of FIGS. 4 and 5 can be accomplished by numerous techniques such as ion implantation, double diffusion, or other such methods known and used by those skilled in the state of the art. The only requirement being that the vertical channel 55 be of the same type material, that it terminate at one end of a buried bit line and at the other end of the surface underlying the thin oxide beneath the word line and the channel be completely surrounded by a gate region of opposite type material.

Figure 8:
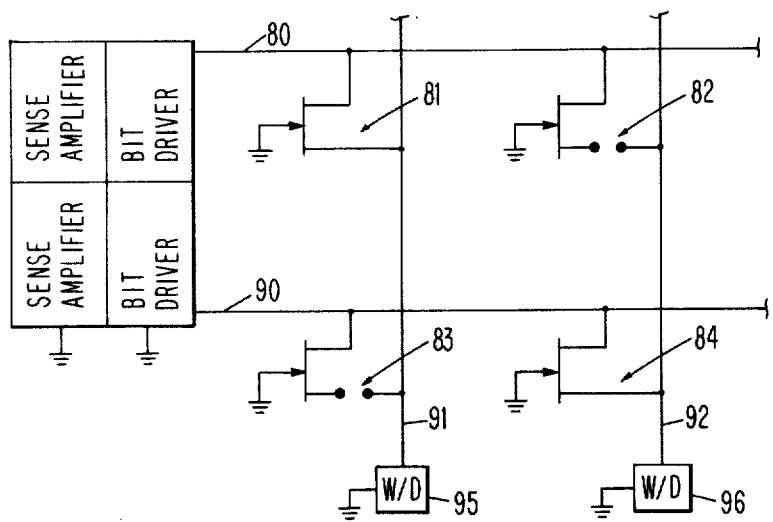
FIG. 8 illustrates schematically a read only memory array in accordance with the present invention.
Figure 9:
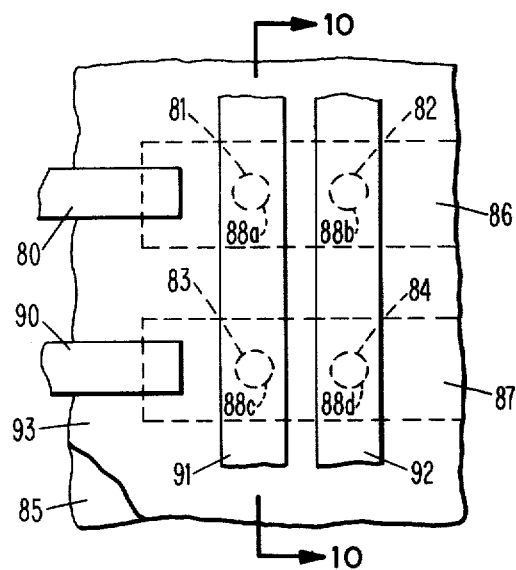
FIG. 9 illustrates a top view of a cell of the array shown in FIG. 8.
Figure 10:
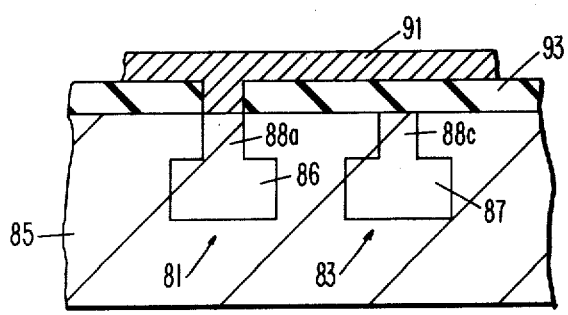
FIG. 10 shows the cell of FIG. 9 taken along the lines 10—10.

It should be further noted that by eliminating the oxide layer 26 and connecting the word line directly to the channel region 55 that a read only memory instead of a random access memory could be created. The circuit for a read only memory array is shown in FIG. 8 and does not require gate drivers. FIGS. 9 and 10 show a top view and a sectional view of such an array. The entire array comprises four transistors 81, 82, 83, and 84 operated in a grounded gate mode. These transistors 81, 82, 83, and 84 are formed in a body of P type silicon 85 by forming, for example, by implantation, buried N regions 86 and 87 which connect to bit lines 80 and 90 respectively. Circular channels 88a, 88b, 88 , and 88d are now formed by implanting a circular N type region downward from the surface to the buried regions 86 and 87. A thick oxide 93 is grown over the entire surface and selectively etched to allow contacts between, for example, word line 91 and channel 88a. This programs the array. For the contact between the word line 91 and the channel 88a indicates that cell 81 will conduct and represent a logical 1 while the lack of contact means that cell 83 will not conduct and will represent a logical 0. Word line 92 is also disposed over the surface of oxide 93 and contacts, for example, cell 84 but is isolated from cell 82. In operation bit lines 80 and 90 and word line 91 and 92 are maintained at +4 volts. To select a particular word, for example, one would bring word line 91 down from +4 volts to ground by means of word line driver 95. Because as shown, cell 81 has a direct connection made between the channel 88a and word line 91, current flows in bit line 80 and this current flow corresponds to a logical 1. Cell 83 on the other hand has the thick oxide 93 between it and the word line 91 thus no current flows in bit line 90 coresponding to a logical 0. Unselected cells 82 and 84 have both their source and drains at +4 volts with respect to their gates hence their channel regions are completely depleted and no current flows.

It should also be realized by those skilled in the art that the described method of producing the device is compatable with known and existing type processes thus allowing driver and support buffers and other circuits to be made on the same chip with the memory array. The particular process described earlier has the additional advantage of providing self-isolation between cells.

It should further be noted that the P type substrate could have long subcollectors diffused in them. Following this diffusion of the subcollector, an N type epitaxial layer could be grown in the desired thickness and this epitaxial layer could then be masked for isolation diffusions in such a way that epi pockets would exist at the ends of the subcollectors as well as producing a small circular region directly over the subcollectors which circular regions would act as the described channels. Following the isolation diffusion, the wafer could be again masked, and then an emitter diffusion provided, if desired. However, such emitter diffusions are not necessary, but may be of interest to those who need or desire greater current flow.

While the invention has been particularly shown and described with reference to the preferred embodiment thereof, it will be understood by those skilled in the art that various changes in form and details of the apparatus and methods may be made therein without departing from the spirit and scope of the invention and that the method is in no way restricted by the device.

What is claimed is:

1. A memory system comprising,
intersecting word and bit lines,
semiconductor memory cells coupling said word lines and said bit lines,
each memory cell comprising,
a junction field effect transistor having a channel region having first and second ends and a gate surrounding said channel region,
said gate being connected to a reference potential,
a bit line connected to the first end of said channel, and
a word line coupled to the other end of said channel.

2. The system of claim 1 wherein each of said cells further includes a charge storage means and wherein said word line is coupled to said second end through said storage mean.

3. The system of claim 2 wherein said charge storage means is a capacitor.

4. The system of claim 1 wherein there is further provided a word line voltage, a bit line voltage and a gate voltage such that said transistor is conductive.

5. The memory system of claim 1 wherein said junction field effect transistor comprises a body of semiconductor material having disposed therein a first diffusion, and a second diffusion disposed within said first diffusion, said second diffusion having a circular opening passing therethrough to form a channel region of the same conductivity of said first diffused region and connecting the surface of the device to said diffused region,
electrode means coupled to said first and second diffused regions,
an oxide layer overlying said source region, and
an electrode deposited over said oxide to form, in cooperation with said source region, a charge storage means.

6. The memory system of claim 1 wherein there is further provided
means for biasing said gate in a common mode with respect to said bit line and said word line.

7. The memory system of claim 1 wherein said gate is connected to ground.

8. The memory system of claim 1 wherein said field effect transistor is a depletion mode field effect transistor having a source, a drain, and a gate region.

9. The memory system of claim 8 wherein said word line is coupled to the source of the transistor and said bit line is coupled to the drain of said transistor.

10. a memory cell comprising,
a junction field effect transistor having a first current-carrying electrode, a second current-carrying electrode, a channel region connecting said first electrode and said seond electrode, a gate region surrounding said channel region and charge-storage means,
first means connected to said first electrode,
a word line deposited over, insulated from and aligned with said second electrode,
said second electrode and said word line co-acting to form said charge storage means,
means for selectively applying a voltage to said bit line, said word line and said gate to render said channel conductive and charge and discharge said storage means.

11. A semiconductor storage system comprising,
a plurality of word lines,
a plurality of bit lines,
a plurality of gate lines, a plurality of memory cells, each of said memory cells being coupled to one of said word lines and one of said bit lines and one of said gate lines, each of said memory cells comprising a field effect transistor having a source, a drain, a gate and a charge storage means, the source drain circuit of the transistor being coupled between the storage means and the bit line, the storage means being further coupled to the word line, the gate of the transistor being coupled to the gate line, and means for writing information into and reading information out of a selected memory cell comprising, means for selectively setting a quiescent voltage on a selected bit line, means for selectively setting a quiescent voltage on a selected word line, means for selectively setting a quiescent voltage on a selected gate line, and means for grounding said bit line and simultaneously grounding said gate line while holding said word line at said quiescent voltage to write a first binary information state in the cell by discharging the storage means, and means for returning the voltage on the selected bit line to said quiescent voltage while simultaneously maintaining the selected gate line at ground and simultaneously setting said selected word line at ground to read the charge state in the capacitor and to store charge in the capacitor to establish in the capacitor the second binary state.

12. A semiconductor storage system comprising a plurality of word lines, a plurality of bit lines, and a plurality of gate lines, a plurality of memory cells, each of said memory cells being coupled to one of said word lines, each of said memory cells comprising only a junction field effect transistor, having a source a drain, and a gate, and a charge storage means, the source drain circuit of the transistor being coupled between the storage means and the bit line, the storage means being further coupled to the word line, the gate of the transistor being coupled to the gate line, and, means for writing information into and reading information out of the selected memory cells, means comprising first bias voltage means for selectively setting on a selected word line a first of two different bias voltages of the same polarity simultaneously with the application of a first bias voltage of the first voltage means to the selected word line to establish a uniform charge state in the selected charge storage means, and means for altering the voltage on a selected bit line to the other of said bias voltages while simultaneously altering the bias voltage on the selected word line to the other of said bias voltages to read the charge state on the capacitor, said charge storage means comprising a capacitor, one terminal of which is coupled to said word line.

* * * * *